United States Patent [19]

Ari et al.

[11] Patent Number: 4,737,708
[45] Date of Patent: Apr. 12, 1988

[54] DEVICE FOR TESTING ELECTRICAL OR ELECTRONIC SYSTEMS WITH ELECTROMAGNETIC PULSES

[75] Inventors: Niyazi Ari, Nussbaumen; Diethard Hansen, Berikon; Hans Schär, Basel, all of Switzerland

[73] Assignee: BBC Brown, Boveri & Company, Limited, Baden, Switzerland

[21] Appl. No.: 828,900

[22] Filed: Feb. 13, 1986

[30] Foreign Application Priority Data

Mar. 7, 1985 [CH] Switzerland ............... 1030/85

[51] Int. Cl.$^4$ ............................................. G01R 1/04
[52] U.S. Cl. .................. 324/158 F; 324/158 R; 324/58 R
[58] Field of Search ............... 250/336.1; 324/73 PC, 324/95, 158 F, 158 P, 158 R, 58 A, 58 R; 333/236, 243, 99 R, 245

[56] References Cited

U.S. PATENT DOCUMENTS

| | | | |
|---|---|---|---|
| 2,467,648 | 4/1949 | Alexander | 333/245 |
| 2,831,163 | 4/1958 | Stevens | 324/95 |
| 2,967,996 | 1/1961 | Bradford | 324/95 |
| 3,025,462 | 3/1962 | King | 324/58 A |
| 3,025,480 | 3/1962 | Guanella | 333/243 |
| 3,197,696 | 7/1965 | Bibo | 324/95 |
| 3,651,400 | 3/1972 | McMartin et al. | 324/58 R |
| 4,278,933 | 7/1981 | Klopach et al. | 324/58 R |
| 4,581,291 | 4/1986 | Bongianni | 333/243 |

FOREIGN PATENT DOCUMENTS 0454758 3/1975 U.S.S.R. ............... 33/245

OTHER PUBLICATIONS

"EMP Simulators for Various Types of Nuclear EMP Environments", by Baum, IEEE Trans. on Electromag. Compat., vol. EMC-20, #1, 2/78, pp. 35–51.
"A Broadband Electromagnetic Environments Simulator", by Pollard, IEEE Internat. Sym. on Electromag. Compat., 8/77, pp. 73–78.

Primary Examiner—Ernest F. Karlsen
Assistant Examiner—W. Burns
Attorney, Agent, or Firm—Burns, Doane, Swecker & Mathis

[57] ABSTRACT

A gas-filled test cell is used which accommodates the object under test and to which a pulse generator is connected. The test cell is constructed over its entire length as a coaxial line having a ribbon-shaped inner conductor and a round outer conductor. A ribbon-shaped potential plate connected to the outer conductor is arranged plane-parallel to the inner conductor inside the outer conductor at a distance corresponding to at least twice the height of the object under test. The distance is also longer than the shortest distance between the inner conductor and the outer conductor. The ratio between the sum of the width of the inner conductor and its thickness and the diameter of the outer conductor has been selected in such a manner that is between 0.4 and 0.9.

12 Claims, 1 Drawing Sheet

DEVICE FOR TESTING ELECTRICAL OR ELECTRONIC SYSTEMS WITH ELECTROMAGNETIC PULSES

BACKGROUND OF THE INVENTION

The present invention relates to a device for testing electric or electronic systems with electromagnetic pulses.

Devices of this type are known, for example, from articles by M. L. Crawford "IEEE Transactions on Instrumentation and Measurement", Volume IM-26, No. 3, September 1977, pages 225–230 and C. E. Baum "IEEE Transactions on Electromagnetic Compatibility", Volume EMC-20, No. 1, February 1978, pages 35–53.

With a sufficiently large amplitude and rapid rise time, electromagnetic pulses (EMP) can cause damage in electric systems of all types and predominantly in sensitive electronic devices. Particularly in the case of so-called nuclear electromagnetic pulses (NEMP) which are generated by the ignition of a nuclear explosive charge, the typical values of such destructive field amplitudes have field strengths of 50000 V/m and 130 A/m with a rise time of only a few ns.

To be able to develop reliably-acting protective devices for electric systems of all types, simulation facilities are needed in which electromagnetic pulses with a multiple of the NEMP field strengths can be generated. NEMP field strengths of up to ten times are desirable for special tests. It is not possible to generate pulses having such high field strengths with the known facilities.

BRIEF SUMMARY OF THE INVENTION

The present invention is a device of the type initially mentioned, in which electromagnetic pulses having field strengths of more than the typical NEMP field strengths and a rise time of a few ns can be generated.

The advantages of the invention can be essentially seen in the fact that the test facility can be constructed to be very compact with respect to the size of the object to be tested. By constructing the test facility as a coaxial line having a round outer conductor, field distortions and scattering at rectangular outer walls as occur in the previously quoted facilities according to the state of the art are particularly avoided. Due to its coaxial shape, the test cell can also be easily flanged to coaxial pulse generators. By designing the ratio between the sum of the width of the inner conductor and its thickness and the diameter of the outer conductor to be between 0.4 and 0.9, a characteristic impedance of the test cell of between approximately 100 ohms and 40 ohms can be advantageously set in a controlled manner. The characteristic impedance varies with very good linearity with the ratio between these values.

By using $SF_6$ as insulating gas, particularly under overpressure, the electric strength of the test cell can be considerably increased. By filling the test cell with an electrically-insulating gas at under-or overpressure, at various temperature or humidities, and so forth, various climatic conditions can be simulated. Subdividing the internal space of the test cell into two part spaces by means of the potential plate has the advantage that the electromagnetic field can propagate only in one of the two part spaces, that is to say in the part space in which the inner conductor is arranged. The other part space is free of the field and thus forms in an almost ideal manner a cable duct for supplying connecting lines to the object under test. If, in addition, filters are connected into the connecting lines in the area of the penetrations, needed in this case, for the connecting lines through the potential plate, and these filters are carried over the shortest possible distance to the object under test after having been passed through the potential plate, the introduction of interference into the connecting lines can be virtually prevented.

BRIEF DESCRIPTION OF THE DRAWING

The objects, features and advantages of the present invention will become apparent from the following detailed description of the preferred embodiment when read in light of the accompanying drawing, in which.

DETAILED DESCRIPTION OF THE PREFERRED EMBODIMENT

Figure 1:
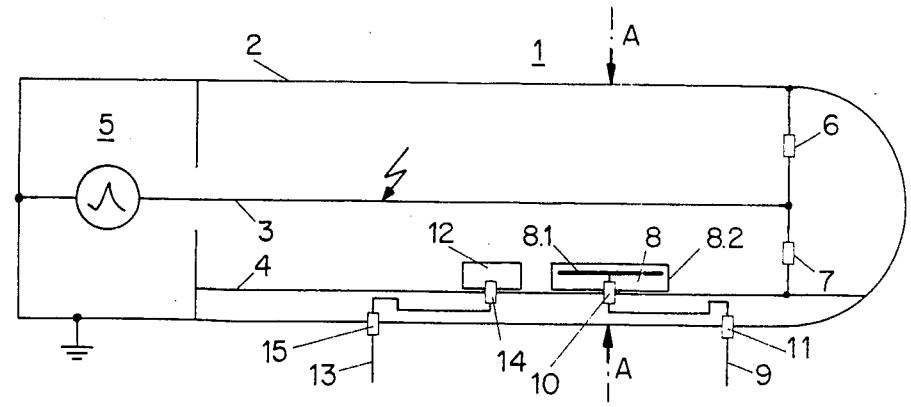
FIG. 1 is a simplified diamgrammatic representation of a longitudinal section through a device according to the present invention.

Referring to FIG. 1, a test cell 1 has a round outer conductor 2 and, coaxially therewith, a ribbon-shaped inner conductor 3. In parallel with the inner conductor 3, a potential plate 4, which is electrically connected to the outer conductor 2, is provided in the test cell 1. This potential plate is preferably arranged as a level support area for the objects to be tested in the lower part of the test cell 1. The test cell 1 can be filled with any type of insulating gas such as, for example, air of $SF_6$ under over- or under-pressure. On the left-hand side in FIG. 1, a coaxial pulse generator 5 is flanged to the test cell 1. On the opposite side, that is to say the right-hand side in FIG. 1, the test cell 1 is terminated with resistors 6 and 7, the total resistance of which preferably corresponds to the characteristic impedance of the test cell 1 or of the coaxial line of outer conducor 2 and inner conductor 3 forming it. In FIG. 1, an object 8 under test rests on the potential plate 4. The object 8 under test, shown by way of example, consists of a printed circuit board 8.1, equipped with electronic components, in a housing 8.2. From the object under test 8, a connecting line 9 is carried via a penetration and filter means 10 through the potential plate 4 and via a gas-tight penetration and filter means 11 through the outer conductor 2 to the outside. In the vicinity of the object 8 under test, a field sensor 12 is arranged in the test cell 1 from which sensor, as from the test object 8, a connecting line 13 is carried to the outside via penetrations and filter means 14 and 15 through the potential plate 4 and the outer conductor 2. The field sensor 12 is used for measuring the electric and/or the magnetic field strength in the vicinity of test object 8. Naturally, separate sensors can also be used for determining the electric and the magnetic field strength. Also, more connecting lines than the two lines 9 and 14 shown in FIG. 1 would probably be required in practice. Correspondingly, two connecting lines 9.1 and 9.2 have been drawn in FIG. 2 in which a cross-section through the test cell 1 according to FIG. 1 is shown at the level of the section line A—A drawn in FIG. 1, which connecting lines are carried from the test object 8 to the outside via penetrations and filter means 10.1, 11.1 and 10.2, 11.2 respectively.

Figure 2:
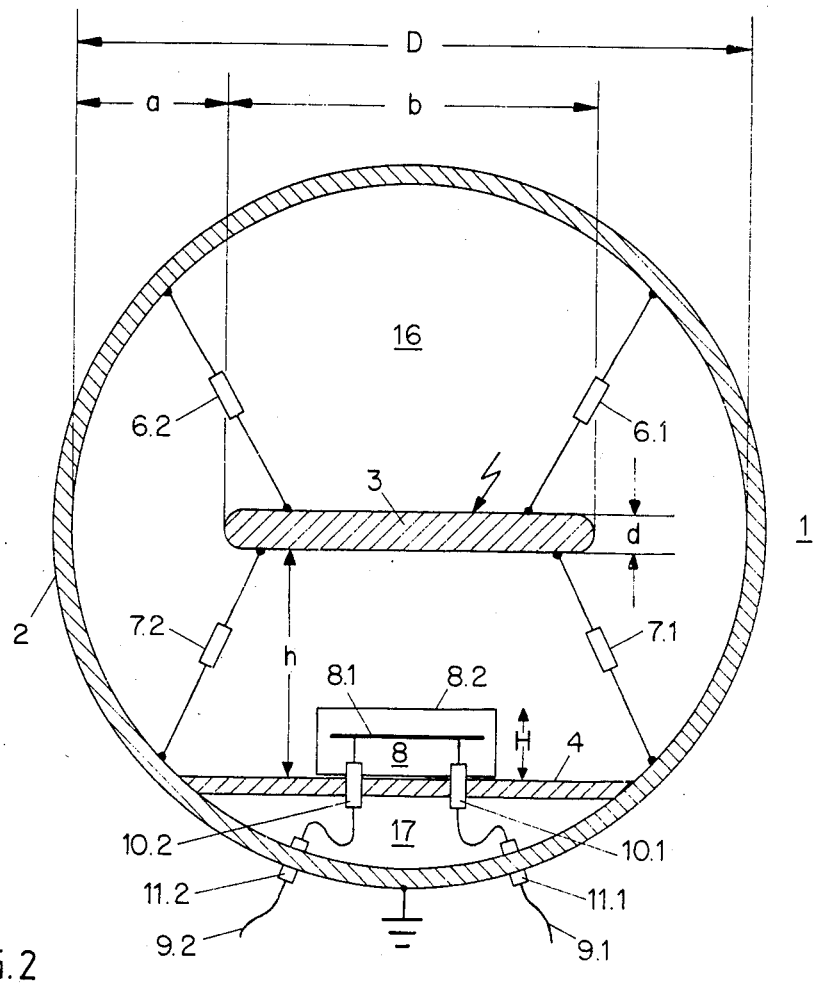
FIG. 2 is a cross-sectional view through such a device.

In addition, the resistors 6 and 7 according to FIG. 1 are in each case subdivided into resistors 6.1, 6.2 and 7.1, 7.2 respectively in FIG. 2. Otherwise, all parts of FIG. 2 correspond to those of FIG. 1 and have also been provided with the same reference symbols.

In FIG. 2 the coaxial construction, according to the present invention, of the test cell 1 with the potential plate 4, which is plane-parallel with respect to the ribbon-shaped inner conductor 3 and is also ribbon-shaped can be seen particularly clearly. Due to the plane-parallelity of inner conductor 3 and potential plate 4 and the electric connection of potential plate 4 and outer conductor 2, a largely homogeneous distribution of the electric field is set up between the inner conductor 3 and the potential plate 4 in the area of the object 8 under test in the electromagnetic fields generated by the pulse generator 5 in the test cell 1. Since the test object 8 itself has an interfering effect on the homogeneity of the electric field distribution, its height H should be smaller than half the distance h between the inner conductor 3 and the potential plate 4 but, even better, even smaller than one third of this distance.

So that no flash-overs occur between the inner conductor 3 and the potential plate 4 with a typical NEMP field strength of 50000 V/m with air under normal pressure as the insulating gas, the spacing h between them should be greater than the shortest distance a between the inner conductor 3 and the outer conductor 2. By using an insulating gas which is electrically more negative than air, for example $SF_6$, the breakdown strength of the test cell 1 can be considerably increased, particularly under overpressure. Using compressed insulating gases has another advantage, apart from increasing the dielectric strength of the test cell. This is because it can happen during tests with electromagnetic pulses that the induced voltages on the object under test itself assume values which are so high that an electric flash-over occurs between two different places on the object under test or between the object under test and the test cell. Such flash-overs can be suppressed, if necessary, by compressed insulating gases. This provides the possibility of separately investigating breakdown phenomena.

The breakdown strength is also influenced by the type of the test gas. By replacing dry air with dry $SF_6$ at the same pressure, the dielectric strength is increased by about a factor of 2. The dielectric strength is approximately proportional to the gas pressure within a wide pressure range. Instead of air or $SF_6$, mixed quantities of various gases can also be used with advantage, for example nitrogen to which $CO_2$ has been added.

IF the test cell 1 is designed for an overpressure of at least 5 times, field strengths of up to one order of magnitude above the typical NEMP field strength can be generated between the inner conductor 3 and the potential plate 4.

The characteristics of the test cell 1 are very significantly determined by the magnitude of its characteristic impedance. This should be between 40 ohms and 100 ohms but preferably about 70 ohms. Within the range mentioned, the characteristic impedance is approximately a linear function of the ratio between the sum of the width b and the thickness d of the inner conductor 3 and the inside diameter D of the outer conductor 2. The impedance value of 40 ohms corresponds to a ratio of 0.9, the impedance value of 100 ohms to a ratio of 0.4 and the impedance value of 70 ohms to a ratio of 0.6. But the preceding values only apply to the case where the thickness d of the inner conductor 3 is small as compared with its width b. This ratio should therefore not be greater than approximately 0.2.

A particularly advantageous development of the device according to the present invention is produced if the two edges of the ribbon-shaped potential plate 4 meet flush with the outer conductor 2 and thus subdivide the inner space of the test cell 1 into two part space 16 and 17 which are closed off from each other. The electromagnetic fields generated by the pulse generator 5 are then able to propagate only in the part space 16 containing the inner conductor 3 and the test object 8, but not in the part space 17. The latter remains free of field and thus forms an ideal cable duct for the connecting lines 9, 9.1, 9.2 and 13. Interference introduced into these connecting lines caused by the electromagnetic fields in the part space 16 can be avoided if the connecting lines, as shown in the Figures, are carried directly from below through the potential plate 4 into the test object 8 or the field strength sensor 12. In the penetrations of all connecting lines through the potential plate 4, filters, not shown in the Figures, can be additionally provided to eliminate interference signals, which occur on the connecting lines in spite of the previously described measure, even before they can penetrate into the fieldfree part space 17.

By flooding the test cell with various gases, for example with air of varying humidity, also under over- or underpressure, various claimatic conditions can be simulated in an advantageous manner. Underpressure investigations are of interest, for example, with respect to electronic components used in aircraft.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention.

What is claimed is:

1. A device for testing an electric or electronic system with electromagnetic pulses, said electric or electronic system having a height H, comprising a gas-filled test cell which accommodates the electric or electronic system under test, to which cell a pulse generator is connected, wherein the test cell is constructed over its entire length as a coaxial line having a ribbon-shaped inner conductor witha width b and a thickness d and a cylindrical outer conductor with a diameter D, said inner conductor being spaced from said outer conductor by at least a shortest distance a, wherein a ribbon-shaped potential plate connected to the outer conductor is arranged plane-parallel to the inner conductor inside the outer conductor at a distance from said inner conductor which corresponds to at least twice the height H of the electric or electronic system under test, said distance being greater than the shortest distance a between the inner conductor and the outer conductor and a ratio between a sum of the width b of the inner conductor and its thickness and the diameter D of the outer conductor is between 0.4 and 0.9.

2. The device of claim 1, wherein the test cell is constructed to be gas-tight for an over-pressure of at least 5 times ambient pressure or a vacuum.

3. The device of claim 1, wherein the test cell is filled with an insulating gas.

4. The device of claim 1, wherein the ratio between the width of the inner conductor and the thickness of the inner conductor is is greater than or equal to 5.

5. The device as claimed in claim 1, wherein the ratio between the sum of the width of the inner conductor and the thickness of the inner conductor and the diameter of the outer conductor is 0.6.

6. The device of claim 1, wherein the test cell is terminated with a resistor which corresponds to its characteristic impedance.

7. The device of claim 1, wherein at least one sensor for determining electric and magnetic field strengths of said electromagnetic pulses is arranged in the test cell.

8. The device of claim 1, wherein the inner space of said cylindrical outer conductor is subdivided into first and second part spaces by the potential plate, said inner conductor being arranged in said first part space.

9. The device of claim 8, wherein connecting lines of the electric or electronic system under test are carried through the outer conductor into said second part space and from there through the potential plate over a distance to the electric or electronic system under test, the distance traversed by said connecting lines froms aid potential plate to said electric or electronic system under test being as short as possible.

10. The device of claim 9, wherein the connecting lines are carried via filters at the point of penetration of the connecting lines through the potential plate.

11. The device of claim 3, wherein said insulating gas is $SF_6$.

12. A device for testing an electric or electronic system with electromagnetic pulses, said electric or electronic system having a height H, comprising a gas-filled test cell which accommodates the electric or electronic system under test, said test cell being constructed to be gas-tight for an overpressure of at least five times ambient pressure or for a vacuum, to which cell a pulse generator is connected, wherein the test cell is constructed over its entire length as a coaxial line having a ribbon-shaped inner conductor with a width b and a thickness d and a cylindrical outer conductor with a diameter D, said inner conductor being spaced from said outer conductor by at least a shortest distance a, wherein a ribbon-shaped potential plate connected to the outer conductor is arranged plane-parallel to the inner conductor inside the outer conductor at a distance from said inner conductor which corresponds to at least twice the height H of the electric or electronic system under test, said distance being greater than the shortest distance a between the inner conductor and the outer conductor and a ratio between a sum of the width b of the inner conductor and its thickness and the diameter D of the outer conductor is between 0.4 and 0.9, said potential plate subdividing the inner space of said cylindrical outer conductor into first and second part spaces with said inner conductor being arranged in said first part space, and wherein connecting lines of the electric or electronic system under test are carried through the outer conductor into said second part space and from there through the potential plate over a distance to the electric or electronic system under test, the distance traversed by said connecting lines from said potential plate to said electric or electronic system under test being as short as possible.

* * * * *